(12) United States Patent
Qian et al.

(10) Patent No.: US 9,791,851 B2
(45) Date of Patent: Oct. 17, 2017

(54) QUICK PROCESSING SYSTEM AND METHOD FOR SMT EQUIPMENT

(71) Applicant: VAYO (SHANGHAI) TECHNOLOGY CO., LTD., Pudong New Area, Shanghai (CN)

(72) Inventors: Shengjie Qian, Shanghai (CN); Yongjian Qu, Shanghai (CN); Fengshou Liu, Shanghai (CN); Zhongliang Zhu, Shanghai (CN)

(73) Assignee: VAYO (SHANGHAI) TECHNOLOGY CO., LTD., Shanghai (CN)

(*) Notice: Subject to any disclaimer, the term of this patent is extended or adjusted under 35 U.S.C. 154(b) by 520 days.

(21) Appl. No.: 14/387,751

(22) PCT Filed: Jan. 30, 2013

(86) PCT No.: PCT/CN2013/071099
§ 371 (c)(1),
(2) Date: Sep. 24, 2014

(87) PCT Pub. No.: WO2013/166869
PCT Pub. Date: Nov. 14, 2013

(65) Prior Publication Data
US 2015/0066180 A1    Mar. 5, 2015

(30) Foreign Application Priority Data

May 9, 2012 (CN) .......................... 2012 1 0142864

(51) Int. Cl.
G06F 19/00 (2011.01)
G05B 19/418 (2006.01)
(Continued)

(52) U.S. Cl.
CPC ....... G05B 19/418 (2013.01); G05B 19/4097 (2013.01); G06F 17/50 (2013.01);
(Continued)

(58) Field of Classification Search
None
See application file for complete search history.

(56) References Cited

U.S. PATENT DOCUMENTS 5,204,912 A * 4/1993 Schimanski ....... G01R 31/2808
348/126
5,506,793 A * 4/1996 Straayer ............. G01R 31/2805
348/125
(Continued)

FOREIGN PATENT DOCUMENTS

| CN | 1400555 A | 3/2003 |
|---|---|---|
| CN | 101833711 A | 9/2010 |
| CN | 102682166 A | 9/2012 |

OTHER PUBLICATIONS

May 9, 2013 International Search Report issued in Application No. PCT/CN2013/071099.

*Primary Examiner* — Adam Lee
(74) *Attorney, Agent, or Firm* — Oliff PLC (57) ABSTRACT

The present invention provides a quick processing system and method for SMT equipment, that is: firstly read PCB design files and BOM files inputted, and generate core data including text data and graphic data of all components to be assembled; then search the component data matched with each component to be assembled in the local database on basis of the core data, and link the found component information with the corresponding component to be assembled, and mark the component information as an available component, and create component information on basis of the core data of the component to be assembled, and stored to the local database, then mark the component
(Continued)

information as an available component, and recover the component information on basis of the graphic data in the core data as an error is checked out; finally output the validated component information to the SMT equipment system.

10 Claims, 2 Drawing Sheets

(51) Int. Cl.
*G06F 17/50* (2006.01)
*G05B 19/4097* (2006.01)
(52) U.S. Cl.
CPC ........... *G05B 2219/2602* (2013.01); *G05B 2219/45026* (2013.01)

(56) References Cited

U.S. PATENT DOCUMENTS

| | | | | |
|---|---|---|---|---|
| 5,517,234 A * | 5/1996 | Gerber | ............... | G01N 21/956 348/125 |
| 5,761,093 A * | 6/1998 | Urbish | ............ | G05B 19/41875 700/107 |
| 5,781,447 A * | 7/1998 | Gerdes | ............... | H05K 13/08 345/419 |
| 5,822,210 A * | 10/1998 | Kobayashi | ............ | H01L 22/20 257/E21.525 |
| 6,496,957 B1 * | 12/2002 | Kumagai | ............ | G06F 17/50 716/112 |
| 6,754,551 B1 * | 6/2004 | Zohar | ............ | B41J 2/01 228/43 |
| 6,983,278 B1 * | 1/2006 | Yu | ............ | G06F 21/606 |
| 7,114,249 B2 * | 10/2006 | Murakami | ............ | G01N 21/956 29/825 |
| 7,874,067 B1 * | 1/2011 | Hiew | ............ | G06F 1/1632 29/831 |
| 8,760,185 B2 * | 6/2014 | Suto | ............ | G01R 31/2808 324/446 |
| 2004/0089413 A1 * | 5/2004 | Murphy | ............ | G06F 17/5068 156/250 |
| 2004/0208353 A1 * | 10/2004 | Murakami | ............ | G01N 21/956 382/145 |
| 2005/0080502 A1 * | 4/2005 | Chernyak | ............ | G06F 17/50 700/97 |
| 2005/0190959 A1 * | 9/2005 | Kohler | ............ | G01R 31/2813 382/147 |
| 2006/0015844 A1 * | 1/2006 | Johnson | ............ | G06F 8/36 717/106 |
| 2007/0238359 A1 * | 10/2007 | Gutierrez | ............ | H01F 27/027 439/620.01 |
| 2009/0105868 A1 * | 4/2009 | Haarberg | ............ | G05B 19/41805 700/121 |
| 2009/0105983 A1 * | 4/2009 | Variyam | ............ | G01R 31/31905 702/124 |
| 2011/0102575 A1 * | 5/2011 | Case | ............ | G01N 21/8806 348/87 |
| 2011/0130860 A1 * | 6/2011 | Kelley | ............ | H05K 3/4638 700/121 |
| 2011/0315608 A1 * | 12/2011 | Chen | ............ | H05K 13/028 209/576 |
| 2012/0105096 A1 * | 5/2012 | Kuah | ............ | G01R 31/2812 324/763.01 |

* cited by examiner

QUICK PROCESSING SYSTEM AND METHOD FOR SMT EQUIPMENT

BACKGROUND OF THE PRESENT INVENTION

Field of Invention

The present invention relates to the field of surface mounted technology, particularly relates to a quick processing system and a method applied in SMT equipment.

Description of Related Arts

SMT is short for surface mounted technology, which is the most popular technology and process in the current electronics assembly industry. It compresses the traditional electronic components into a device with only a few tenths of the volume, thereby achieving in the electronic product assembly with high density, high reliability, miniaturization, low cost, and production automation. The miniaturized component is named as SMT component (also known as SMC, chip component). The process for assembling components to the printing circuit boards (or other substrate) is called SMT process. Currently, the SMT process has been widely applied in advanced electronic products, especially in the electronics products of computer and communications. The international production of SMD equipment rises year on year, while the traditional equipment yields declining, such that SMT technology becomes increasingly popular over time. The related assembly equipment is named as SMT equipment, which is controlled by its SMT processing system as performs production operation on the production line.

In the prior art, SMT programming system in industry is nothing less than two categories: one is a built-in software system provided by its equipments maker, and the other is a programming system developed by third-parties. The SMT programming system provided with equipments focuses on the operational performance optimization of an equipment, i.e. the producing and mounting efficiency of the equipment within a stipulated time in the production, while ignoring programming efficiency in offline. The other SMT programming system provided by third-party software companies, focuses on conversion of the EDA (electronic design automation) CAD design, R&D data and Gerber (Gerber files) data; due to the non-openness of the operating parameters of the equipment, the technical solutions of third-parties can not improve the operational performance of the equipment well, especially in the modular chip mounters of the current mainstream, wherein the operational parameters of the equipment is not available, that becomes a urgent technical problem to be solved for those practitioners in the art.

With the variation in the industry, the production with small quantities and many varieties has accounted for a large proportion, and the existing major procedure in the industry is that: convert the coordinate files generated by designed layout files, EDA CAD or Gerber into a system, and only combine the BOM files by using the coordinate files to generate a chip mounter program. However, there mainly needs the following work for a complete program: 1. coordinate data for mounting needs to be correct, wherein the coordinates and angles need to be correct; 2. component database data is needed; 3. preferable programming optimization results are needed to maximize improvement of the operational performance of the equipment. Aim at the above three aspects, the SMT programming systems provided by third-party software companies commonly accomplish the first aspect, while the second and third aspects are accomplished by the built-in software system by its equipment maker. However, in the software system of the equipment, it usually requires the operator or user to manually accomplish the work of second aspect, i.e., a creation or modification of component database data, to ensure the ideal accomplishment of the third aspect. In short, the major disadvantage of all the current processing system for SMT equipment is that it just utilizes the coordinate data, and requires a large amount of time on the selection and production of component database data for a chip mounter, and the accomplishment of program is followed by detecting whether the angles and polarity of the amounted components is correct in production, which occupies a large amount of production time, thereby reducing the production efficiency, and increasing the production cost.

SUMMARY OF THE PRESENT INVENTION

In view of the above disadvantages of the prior art, the object of the present invention is to provide a quick processing system and a method for SMT equipment, to solve the problems that the quick processing system for SMT equipment in the art requires a large amount of time to produce the component database data and to artificially rectify the angles of amounted component, which results in low manufacturing process efficiency and low production yields caused by polarity errors.

In order to achieve the above object and other related objects, the present invention provides a quick processing system for SMT equipment, to control the SMT equipment system to perform a PCB assembly or an AOI test operation, the quick processing system for SMT equipment at least includes:

a data input module, to read PCB design files and BOM files inputted, and to generate core data comprising text data and graphic data of all components to be assembled;

a core data module, to connect with the data input module, and to share data with the SMT equipment system and a component shared database with component shared database, including:

a local database, to share data with the SMT equipment system and the component shared database, and to store built-in component information, or component information derived from the SMT equipment system or the component shared database, the component information includes attribute information, packaging information, polarity information, graphics information of the components, and nozzle information and feeder information corresponding to each component;

a search unit, to connect with the data input module and the local database, and to read the core data from the data input module, and to search the component data matched with each component to be assembled in the local database on basis of the core data, and to link the found component information with the corresponding component to be assembled, in which the component information is marked as an available component, and to output a command for creating component information as no matched component data with each component to be assembled is found in the local database;

a creation unit, to connect with the data input module and the search unit, and after receiving the command for creating component information, to create component information on basis of the core data of the component to be assembled, and to store the created component information to the local database, and to mark the component information as an available component;

a verification unit, to connect with the data input module and the local database, to verify the component information marked as an available component in the local database, and to recover the component information marked as the available component on basis of the graphic data in the core data as an error is checked out;

a data output module, to connect with the core data module and the SMT equipment system, to output the component information validated by the verification unit to the SMT equipment system, to make it perform the PCB assembly or the AOI test operation.

In the quick processing system for SMT equipment of the present invention, the inputted PCB design files read by the data input module include CAD files, Gerber files, and coordinate files corresponding to the Gerber files; the text data includes component codes, component descriptions, component profile names, and component height; the graphical data includes frame size of components, pin size of components, pin quantity, pin pitch, identification of polarity points, and location of the first pin.

In the quick processing system for SMT equipment of the present invention, when the search unit searches the component data matched with each component to be assembled, firstly determine whether the component attribute matched with the component to be assembled that found from the local database on basis of the text data exists; if yes, link the found component information with the corresponding component to be assembled, and mark the component information as an available component; if no, followed by determining whether the graphic information matched with the component to be assembled that found from the local database on basis of the graphic data exists, if yes, link the found component information with its corresponding component data to be assembled, and mark the component information as an available component.

In the quick processing system for SMT equipment of the present invention, after the creation unit receives the command for creating component information, first determine the format of the PCB design files, and when the PCB design file is determined as a CAD file, create component information on basis of the core data of the component to be assembled; and when the PCB design file is determined as a Gerber file, it requires to firstly create pin information of the component to be assembled, followed by creating component information on basis of the core data of the component to be assembled.

In the quick processing system for SMT equipment of the present invention, when the verification unit verifies the component information marked as an available component in the local database, first verify that whether the frame size of components, pin size of components, pin quantity, pin pitch, identification of polarity points, and location of the first pin in the component information are consistent with its core data; if yes, pass verification; if no, output the validation error message, and on basis of the graphic data of the core data, fix the frame size of components, pin size of components, pin quantity, pin pitch, identification of polarity points, and location of the first pin in the component information of the available component to coincide with its core data.

The present invention further provides a quick processing method for SMT equipment, to control the SMT equipment system to perform a PCB assembly or an AOI test operation, the quick processing method for SMT equipment at least includes the following steps:

creating a local database, which prestores built-in component information, or component information derived from the SMT equipment system or a component shared database, the component information includes attribute information, packaging information, polarity information, graphics information of the components, and nozzle information and feeder information corresponding to each component;

reading PCB design files and BOM files inputted, and generating core data comprising the text data and graphic data of all components to be assembled;

reading the core data, and searching the component data matched with each component to be assembled in the local database on basis of the core data, and linking the found component information with the corresponding component to be assembled, and marking the component information as an available component, and outputting a command for creating component information as no matched component data with each component to be assembled is found in the local database;

creating component information on basis of the core data of the component to be assembled, and storing the created component information to the local database, and marking the component information as an available component;

verifying the component information marked as an available component in the local database, and recovering the component information marked as the available component on basis of the graphic data in the core data as an error is checked out;

outputting the validated component information to the SMT equipment system, to make it perform the PCB assembly or the AOI test operation.

In the quick processing method for SMT equipment of the present invention, the read inputted PCB design files include CAD files, Gerber files, and coordinate files corresponding to the Gerber files; the text data includes component codes, component descriptions, component profile names, and component height; the graphical data includes frame size of components, pin size of components, pin quantity, pin pitch, identification of polarity points, and location of the first pin.

In the quick processing method for SMT equipment of the present invention, when searching the component data matched with each component to be assembled, firstly determine whether the component attribute matched with the component to be assembled that found from the local database on basis of the text data exists; if yes, link the found component information with the corresponding component to be assembled, and mark the component information as an available component; if no, followed by determining whether the graphic information matched with the component to be assembled that found from the local database on basis of the graphic data exists, if yes, link the found component information with its corresponding component data to be assembled, and mark the component information as an available component.

In the quick processing method for SMT equipment of the present invention, after receiving the command for creating component information, first determine the format of the PCB design files, and when the PCB design file is determined as a CAD file, create component information on basis of the core data of the component to be assembled; and when the PCB design file is determined as a Gerber file, it requires to firstly create pin information of the component to be assembled, followed by creating component information on basis of the core data of the component to be assembled.

In the quick processing method for SMT equipment of the present invention, when verifying the component information marked as an available component in the local database, first verify that whether the frame size of components, pin size of components, pin quantity, pin pitch, identification of polarity points, and location of the first pin in the component information are consistent with its core data; if yes, pass verification; if no, output the validation error message, and on basis of the graphic data of the core data, fix the frame size of components, pin size of components, pin quantity, pin pitch, identification of polarity points, and location of the first pin in the component information of the available component to coincide with its core data.

As described above, the quick processing system and method for SMT equipment of the present invention solve the problems of, in the prior art of the quick processing system for SMT equipment, low manufacturing process efficiency caused by the requirement of a large amount of time to produce the component database data, and low production yields caused by no verification on the angles and polarity of the component, etc. The quick processing system and method for SMT equipment of the present invention greatly shorten the overall programming cycle of a new model, sufficiently reduce the occupied time of the programming and debugging of the machine, and reasonably save human cost. Compare to the current industry solution, it has the following beneficial effects: through the administration of the quick processing system and method for SMT equipment of the invention, it enables to maximally utilize the designed information, i.e., to achieve a 100% accurate utilization; the time spent for acquisition of intelligent datum point and board information is saved with no less than 15 minutes; the time spent for intelligent matching and creating component information database is saved by 80%, while the debugging time for rectifying automatic angles and polarity is saved by 90%; and the equipment program data is guaranteed to be accurate and complete within the seamless generation of the equipment program. The quick processing system and method for SMT equipment of the present invention turn the job from tedious to simple and foolproof, and shorten the job from the original 4-8 hours or more to within 0.5-2 hours, thereby overall improving the efficiency over 60%.

INSTRUCTIONS OF UNIT LABELS 1 quick processing system for SMT equipment
11 data input module
12 core data module
121 local database
122 search unit
123 creation unit
124 verification unit
13 data output module
2 SMT equipment system
3 component shared database
S1~S6 step

DETAILED DESCRIPTION OF THE PREFERRED EMBODIMENTS

The embodiment modes of the present invention are described hereunder through specific examples, and persons skilled in the art may easily understand other advantages and efficacies of the present invention from the contents disclosed in the present description. The present invention may be further implemented or applied through other different specific embodiment modes, and various modifications or amendments may also be made to each of the details in the present description based on different perspectives and applications without departing from the spirit of the present invention.

Figure 1:
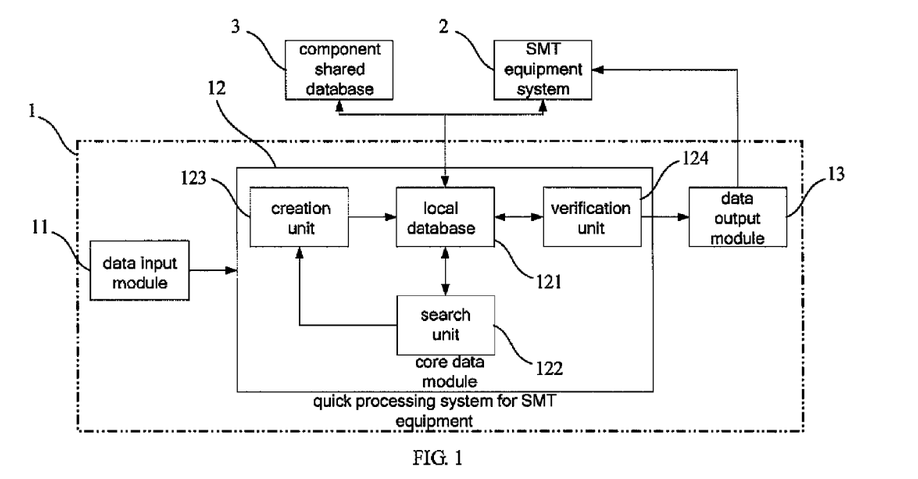
FIG. 1 shows a block diagram of a quick processing system for SMT equipment of the present invention.
Figure 2:
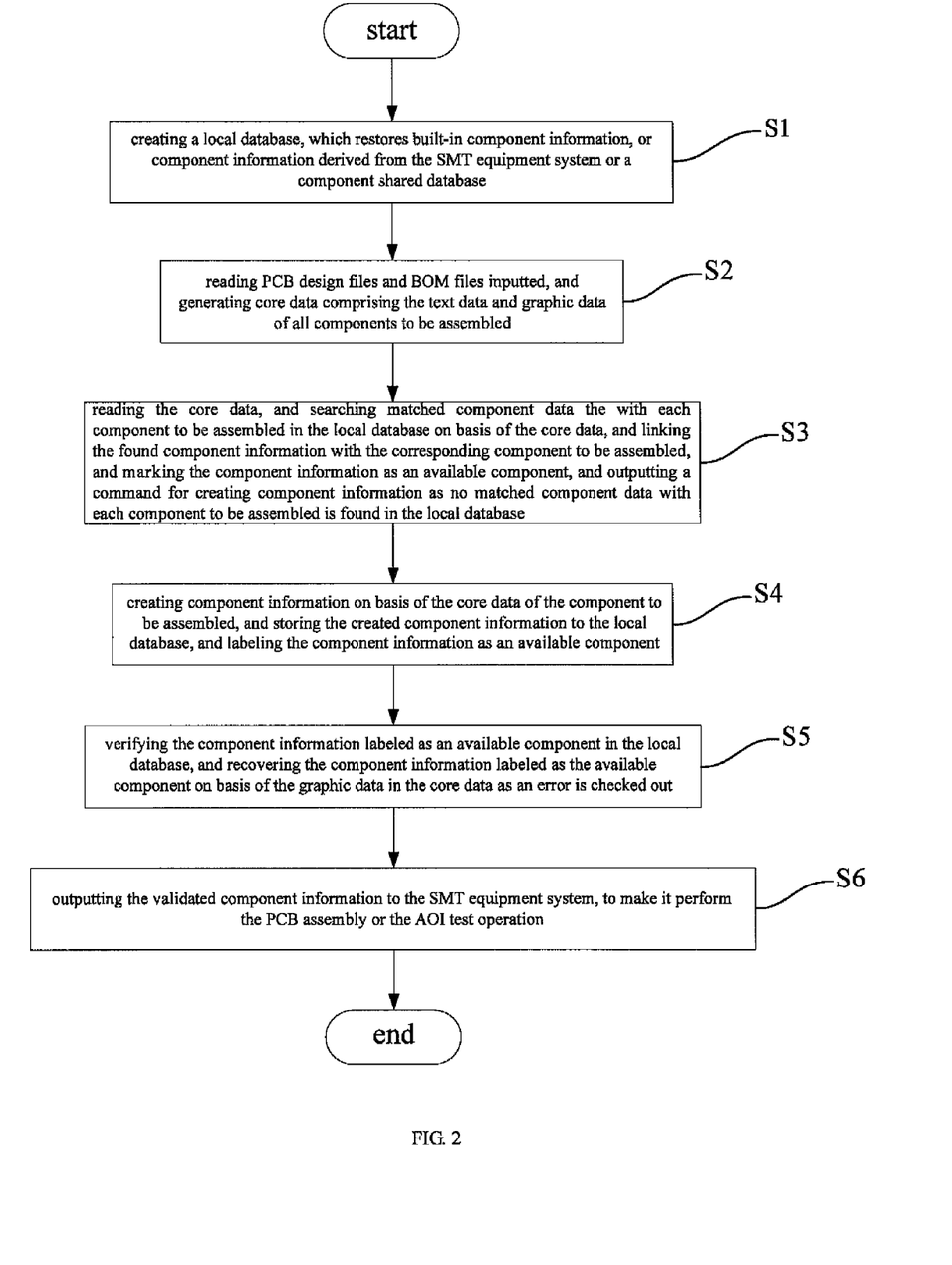
FIG. 2 shows a flow chart of a quick processing method for SMT equipment of the present invention.

Please refer to FIG. 1 to FIG. 2. It is to be noted that the drawings provided in the present embodiment only explain the basic conception of the present invention in an illustrative manner, so the drawings only display the components relevant to the present invention rather than being drawn according to the number, shape and size of the components during actual implementation, the shape, number and scale of each component may be randomly changed during its actual implementation, and the layout of the components thereof might also be more complicated.

First Embodiment

Please refer to FIG. 1, which shows a block diagram of a quick processing system for SMT equipment of the present invention. The invention provides a quick processing system for SMT equipment, to control an SMT equipment system 2 to perform a PCB assembling operation. In the embodiment, the SMT equipment system 2 comprises an involving assembling equipment and an AOI (Automatic Optic Inspection) detecting equipment and the like in the manufacture process of SMT, such as equipments of Fuji equipment system or Siplace equipment system, etc., being available for PCB assembling operation or AOI detection. As shown in the figure, a quick processing system 1 for SMT equipment at least includes: a data input module 11, a core data module 12, and a data output module 13.

The data input module 11 reads PCB design files and BOM files inputted, and generates core data comprising the text data and graphic data of all components to be assembled. In the embodiment, the input PCB design files read by the data input module 11 includes CAD files, Gerber files, and coordinate files corresponding to the Gerber files; and corresponding to the CAD files, Gerber files and BOM files, the data input module 11 further includes a CAD input unit, a coordinate/Gerber input unit, and a BOM input unit (not illustrated in the figure).

The CAD input unit is used for reading and transforming the CAD files provided by the design and R&D to core data comprising the text data and graphic data of all components to be assembled. The coordinate/Gerber input unit is used for reading and transforming the coordinate and Gerber files provided by the design and R&D to core data comprising the text data and graphic data of all components to be assembled. The BOM input unit is used for reading and transforming the requiring BOM files of manufacture to core data comprising the text data and graphic data of all components to be assembled.

In the embodiment, the text data includes component codes, component descriptions, component profile names, and component height, etc; the graphical data includes frame size of components, pin size of components, pin quantity, pin pitch, identification of polarity points, and location of the first pin, etc.

The core data module 12 is connected with the data input module 11, and shares data with the SMT equipment system 2 and a component shared database 3. In the embodiment, the core data module 12 carries out data sharing connection with the SMT equipment system 2 and the component shared database 3. Specifically, the SMT equipment system 2 provides a read manner of a third-party data, which downloads the component database form the SMT equipment system 2 to the core data module 12, that may be an API provided by Fuji equipment: User Host Interface, an API provided by Siplace equipment: OIB (OPERATIONS INFORMATION BROKER), or other equipment interfaces in the form of text file, database and the like. In the embodiment, the component shared database 3 may be, such as a server connecting with the SMT equipment system 2 through a wide area network or a local area network, or may be another database built-in the quick processing system 1 for SMT equipment.

The core data module 12 includes: a local database 121, a search unit 122, a creation unit 123, and a verification unit 124.

The local database 121 shares data with the SMT equipment system 2 and the component shared database, and stores the built-in component information, or component information derived from the SMT equipment system 2 or the component shared database. Specifically, as a currently used local database 121, the source of its component information may come from three aspects: 1. from the download and analysis of the component information of the SMT equipment system 2 through a read module of the equipment database; 2. from the download and deposition of the component information of the component shared database 3; 3. from its own established component information of the local database 121. In the embodiment, the component information includes the attribute information, packaging information, polarity information, graphics information of the components, and nozzle information and feeder information corresponding to each component.

The search unit 122 is connected with the data input module 11 and the local database 121, to read the core data from the data input module 11, and to search the component data matched with each component to be assembled in the local database 121 on basis of the core data, and to link the found component information with the corresponding component to be assembled, in which the component information is marked as an available component, and to output a command for creating component information as no component data matched with each component to be assembled is found in the local database 121.

In the embodiment, when the search unit 122 searches the component data matched with each component to be assembled, firstly determine whether the component attribute matched with the component to be assembled that found from the local database 121 on basis of the text data exists; if yes, link the found component information with the corresponding component to be assembled, and mark the component information as an available component; if no, followed by determining whether the graphic information matched with the component to be assembled that found from the local database on basis of the graphic data exists, if yes, link the found component information with its corresponding component data to be assembled, and mark the component information as an available component.

Specifically, when the search unit 122 searches the component data matched with each component to be assembled, it includes the following situations: 1. search the component code in the local database 121 to determine whether a totally identical component code exists, if yes, define the component with the component information and mark it by success. 2. As for those components still not getting any component information, search the standard packaging name of the component on basis of the component profile in the CAD or coordinate files and the component descriptions in the BOM files, and use the component information from the local database 121 to define the component without component information and mark it by success. 3. Match the component still not getting any component information on basis of the core graphic data of the system, as the component has more than two pins, search the component with the same number of pins in the local database 121, and simulate it on graphs to make comparisons, and search for the optimum on basis of the IPC-7351 standard to be recommended and defined. As the component has two pins or less than two pins, search for the component information without a pin in the local database 121, and then, make comparisons on basis of the size of the component body and the PC-7351 standard, to search for the suitable component information and define it. 4. As for those components still not getting any component information, output a prompt message to prompt the user to manually search the local database 121, wherein the search allows the length and width of the component body, the number of the component pins, the pitch of the component pins, the profile name of the component information and the like; and determine a suitable one on basis of experience to define. 5. As for those components still not getting any component information, may perform creation through copying the existing component information and modifying parameters. 6. As for those components still not getting any component information, may perform creation through creating a component information module.

The creation unit 123 is connected with the data input module 11 and the search unit 122, and after receiving the command for creating component information, to create component information on basis of the core data of the component to be assembled, and to store the created component information to the local database 121, and mark the component information as an available component.

In the embodiment, after the creation unit 123 receives the command for creating component information, first determine the format of the PCB design files, and when the PCB design file is determined as a CAD file, create component information on basis of the core data of the component to be assembled; and when the PCB design file is determined as a Gerber file, it requires to firstly create pin information of the component to be assembled, followed by creating component information on basis of the core data of the component to be assembled.

Specifically, the core data retains the label of the data source; the source of Gerber files requires a pin selection to create; and the source of CAD files itself has the associated information of the component and pin. Firstly determine the direction of the component, followed by the step of automatic extraction of the frame size of the component, or modification, and followed by the step of selecting the pins to automatically generate the pin information, which includes the coordinate of each pin and the size of pins; create information of the grid array if the pin information comprising the information of pins with grid array then recommend the most suitable nozzle and feeder on basis of the size of the component body. If the component has polarity requirement, followed by selecting graph and location of the polarity marked; within the following step, some parameters of the machinery equipment, such as the operating speed of the component assembly and pick-up locations and the like, may be manually filled in. The above steps may define all the component information, and deposit the newly created component information into the local database 121.

The verification unit 124 is connected with the data input module 11 and the local database 121, to check the component information marked as an available component in the local database 121, and when an error is checked out, recover the component information marked as the available component on basis of the graphic data in the core data.

In the embodiment, when the verification unit 124 verifies the component information marked as an available component in the local database, first verify that whether the frame size of components, pin size of components, pin quantity, pin pitch, identification of polarity points, and location of the first pin in the component information are consistent with its core data; if yes, pass verification; if no, output the validation error message, and on basis of the graphic data of the core data, recover the information of the frame size of components, pin size of components, pin quantity, pin pitch, identification of polarity points, and location of the first pin in the component information of the available component to coincide with its core data.

Specifically, perform intelligent correction of the angle offset and coordinate offset, i.e., simulate the graph of component information with 0 degree onto the graph of the core data, and calculate the pin area of the graph of the core data within the graph of the component information, followed by simulating the graph of component information with 90 degree onto the graph of the core data, and calculate the pin area of the graph of the core data within the graph of the component information, then determine whether there exists polarity on basis of whether there exists polar point in the component information, if no, compare the area contained in the graphs of 0 degree and 90 degree, in which the bigger one is the final and correct angle, and deposit the angle offset. If yes, rather than comparison, perform simulation on the graph of component information with 180 degree onto the graph of the core data, and calculate the pin area of the graph of the core data within the graph of the component information, followed by simulate the graph of component information with 270 degree onto the graph of the core data, and calculate the pin area of the graph of the core data within the graph of the component information, then select the one with the largest area and the nearest location of polarity mark.

Then, sequentially verify and match the component information and core graphs marked as available components in the local database 121 defined by the component information. 1. Determine whether exists a component with both non-profile and non-package. 2. Whether with non-profile. 3. Whether with no packaging information of the feeder. 4. Whether the core of the profile is consistent with that of the core graph. 5. Whether the angle and polarity is inconsistent with the core graph. 6. Whether the number of pins is consistent. If there exists one problem above, no further judgment. Finally, apply manual checking module, and perform modification on corresponding component information aiming at the appearing problems, and again perform automatic verification after the modification, until there is no problem for the modification.

The data output module 13 is connected with the core data module 12 and the SMT equipment system 2, to output the component information validated by the verification unit 124 to the SMT equipment system 2, to make it perform the PCB assembly or the AOI test operation. In the embodiment, the data output mode of the data output module 13 includes the following types:

1) If the SMT equipment system 2 has an open interface, to support the seamless integration of associative output, then the data output module 13 directly output JOB data of related equipment system via the seamless association of the open interface. Such as Fuji API interface, ASM/Siplace OIB interface, e.g., the third-party data output mode provided by the data output module 13, in which, that the data output module 13 outputs the validated component information to the SMT equipment system 2 may be the API: User Host Interface provided by Fuji equipment, the API: OIB (OPERATIONS INFORMATION BROKER) provided by Siplace equipment, or other equipment interfaces in the form of text files, database and the like.

2) The data output module 13 may also output intermediate data in the form of text, or other forms, which is then imported into the SMT equipment system 2.

3) The cooperation between the data output 13 and the SMT equipment system 2 may also be achieved by the embedded interaction.

Second Embodiment

The invention further provides a quick processing method for SMT equipment, to control an SMT equipment system 2 to perform a PCB assembling operation. In the embodiment, the SMT equipment system 2 comprises a related assembling equipment and an AOI (Automatic Optic Inspection) detecting equipment and the like in the manufacture process of SMT, such as the equipments of Fuji equipment system or Siplace equipment system, etc., being available for the PCB assembling operation or AOI detection. The quick processing method for SMT equipment at least includes the following steps:

Firstly perform step S1, create a local database, which prestores built-in component information, or component information derived from the SMT equipment system or the component shared database, the component information includes the attribute information, packaging information, polarity information, graphics information of the components, and nozzle information and feeder information corresponding to each component. Then perform step S2.

In the embodiment, the local database shares data with the SMT equipment system and the component shared database, and stores the built-in component information, or component information derived from the SMT equipment system or the component shared database. Specifically, as a currently used local database, the source of its component information may come from three aspects: 1. from the download and analysis of the component information of the SMT equipment system through a read module of the equipment database; 2. from the download and deposition of the component information of the component shared database 3; 3. from its own established component information of the local database.

In the embodiment, the component shared database 3 may be such as a server connecting with the SMT equipment system 2 through a wide area network or a local area network, or may be another database built-in the quick processing system 1 for SMT equipment.

In step S2, read the inputted PCB design files and BOM files, and generate core data comprising the text data and graphic data of all components to be assembled. In the embodiment, the read inputted PCB design files include CAD files, Gerber files, and coordinate files corresponding to the Gerber files; the text data includes component codes, component descriptions, component profile names, and component height; the graphical data includes frame size of components, pin size of components, pin quantity, pin pitch, identification of polarity points, and location of the first pin. Then perform step S3.

In step S3, read the core data, and search the component data matched with each component to be assembled in the local database on basis of the core data, and link the found component information with the corresponding component to be assembled, and mark the component information as an available component, and output a command for creating component information as no matched component data with each component to be assembled is found in the local database. Then perform step S4.

In the embodiment, when searching the component data matched with each component to be assembled, firstly determine whether the component attribute matched with the component to be assembled that found from the local database on basis of the text data exists; if yes, link the found component information with the corresponding component to be assembled, and mark the component information as an available component; if no, followed by determining whether the graphic information matched with the component to be assembled that found from the local database on basis of the graphic data exists, if yes, link the found component information with its corresponding component data to be assembled, and mark the component information as an available component.

Specifically, when the search unit 122 searches the component data matched with each component to be assembled, it includes the following situations: 1. search the component code in the local database to determine whether a totally identical component code exists, if yes, define the component with the component information and mark it by success. 2. As for those components still not getting any component information, search the standard packaging name of the component on basis of the component profile in the CAD or coordinate files and the component descriptions in the BOM files, and use the component information from the local database to define the component without component information and mark it by success. 3. Match the component without component information on basis of the core graphic data of the system, as the component has more than two pins, search the component with the same number of pins in the local database, and simulate it on graphs to make comparisons, and search for the optimum on basis of the IPC-7351 standard to be recommended and defined. As the component has two pins to or less than two pins, search for the component information without a pin in the local database, and then, make comparisons on basis of the size of the component body and the IPC-7351 standard, to search for the suitable component information and define it. 4. As for those components still not getting any component information, output a prompt message to prompt the user to manually search the local database, wherein the search allows the length and width of the component body, the number of the component pins, the pitch of the component pins, the profile name of the component information and the like; and determine a suitable one on basis of experience to define. 5. As for those components still not getting any component information, may perform creation through copying the existing component information and modifying parameters. 6. As for those components still not getting any component information, may perform creation through creating a component information module.

In step S4, create component information on basis of the core data of the component to be assembled, and store the created component information to the local database, and mark the component information as an available component. Then perform step S5.

In the embodiment, after receiving the command for creating component information, first determine the format of the PCB design files, and when the PCB design file is determined as a CAD file, create component information on basis of the core data of the component to be assembled; and when the PCB design file is determined as a Gerber file, it requires to firstly create pin information of the component to be assembled, followed by creating component information on basis of the core data of the component to be assembled.

Specifically, the core data retains the label of the data source; the source of Gerber files requires a pin selection to create; and the source of CAD files itself has the associated information of the component and pin. Firstly determine the direction of the component, followed by the step of automatic extraction of the frame size of the component, or modification, and followed by the step of selecting the pins to automatically generate the pin information, which includes the coordinate of each pin and the size of pins; create information of the grid array if the pin information comprising the information of pins with grid array, then recommend the most suitable nozzle and feeder on basis of the size of the component body. If the component has polarity requirement, followed by selecting graph and location of the polarity marked; within the following step, some parameters of the machinery equipment, such as the operating speed of the component placement and pick-up locations and the like, may be manually filled in. The above steps may define all the component information, and deposit the newly created component information into the local database.

In step S5, verify the component information marked as an available component in the local database, and when an error is checked out, recover the component information marked as the available component on basis of the graphic data in the core data. Then perform step S6.

In the embodiment, when verifying the component information marked as an available component in the local database, first verify that whether the frame size of components, pin size of components, pin quantity, pin pitch, identification of polarity points, and location of the first pin in the component information are consistent with its core data; if yes, pass verification; if no, output the validation error message, and on basis of the graphic data of the core data, recover the information of the frame size of components, pin size of components, pin quantity, pin pitch, identification of polarity points, and location of the first pin in the component information of the available component to coincide with its core data.

Specifically, perform intelligent correction of the angle offset and coordinate offset, i.e., simulate the graph of component information with 0 degree onto the graph of the core data, and calculate the pin area of the graph of the core data within the graph of the component information, followed by simulating the graph of component information with 90 degree onto the graph of the core data, and calculate the pin area of the graph of the core data within the graph of the component information, then determine whether there exists polarity on basis of whether there exists polar point in the component information, if no, compare the area contained in the graphs of 0 degree and 90 degree, in which the bigger one is the final and correct angle, and deposit the angle offset. If yes, rather than comparison, perform simulation on the graph of component information with 180 degree onto the graph of the core data, and calculate the pin area of the graph of the core data within the graph of the component information, followed by simulating the graph of component information with 270 degree onto the graph of the core data, and calculate the pin area of the graph of the core data within the graph of the component information, then select the one with the largest area and the nearest location of polarity mark.

Then, sequentially verify and match the component information and core graphs marked as available components in the local database defined by the component information. 1. Determine whether exists a component with both non-profile and non-package. 2. Whether with non-profile. 3. Whether with no packaging information of the feeder. 4. Whether the core of the profile is consistent with that of the core graph. 5. Whether the angle and polarity is inconsistent with the core graph. 6. Whether the number of pins is consistent. If there exists one problem above, no further judgment. Finally, apply manual checking module, and perform modification on corresponding component information aiming at the appearing problems, and again perform automatic verification after the modification, until there is no problem for the modification.

In step S6, output the validated component information to the SMT equipment system, to make it perform the PCB assembly or the AOI test operation. In the embodiment, the data output mode of outputting the validating component information to the SMT equipment system includes the following types:

1) If the SMT equipment system has an open interface, to support the seamless integration of associative output, then, directly output JOB data of related equipment system via the seamless association of the open interface. Such as Fuji API interface, ASM/Siplace OIB interface, e.g., the provided third-party data output mode, in which, that outputting the validating component information to the SMT equipment system may be the API: User Host Interface provided by Fuji equipment, the API: OIB (OPERATIONS INFORMATION BROKER) provided by Siplace equipment, or other equipment interfaces in the form of text files, database and the like.

2) Or, output intermediate data in the form of text, or other forms, which is then imported into the SMT equipment system.

3) Or, achieve the cooperation between the two by the embedded interaction.

To sum up, the quick processing system and method for SMT equipment of the present invention solve the problems of, in the prior art of the quick processing system for SMT equipment, low manufacturing process efficiency caused by the requirement of a large amount of time to produce the component database data, and low production yields caused by no verification on the angles and polarity of the component, etc. The quick processing system and method for SMT equipment of the present invention greatly shorten the overall programming cycle of a new model, sufficiently reduce the occupied time of the programming and debugging of the machine, and reasonably save labor cost. Compare to the current industry solution, it has the following beneficial effects: through the administration of the quick processing system and method for SMT equipment, it enables to maximally utilize the designed information, i.e., to achieve a 100% accurate utilization; the time spent for acquisition of intelligent datum point and board information is saved with no less than 15 minutes; the time spent for intelligent matching and creating component information database is saved by 80%, while the debugging time for rectifying automatic angles and polarity is saved by 90%; and the equipment program data is guaranteed to be accurate and complete within the seamless generation of the equipment program. The quick processing system and method for SMT equipment of the present invention turn the job from tedious to simple and foolproof, and shorten the job from the original 8 hours or more to within 2 hours, thereby overall improving the efficiency over 50%.

The abovementioned embodiments only illustratively describe the principle and efficacy of the present invention, rather than being used to limit the present invention. Any person skilled in the art may modify or amend the abovementioned embodiments without departing from the spirit and scope of the present invention. Thus, all equivalent modifications or amendments accomplished by persons having common knowledge in the technical field concerned without departing from the spirit and technical thoughts revealed by the present invention shall still be covered by the claims of the present invention.

What is claimed is:

1. A quick processing system for Surface Mount Technology (SMT) equipment that controls the SMT equipment system to perform a Printed Circuit Board (PCB) assembly or an Automatic Optic Inspection (AOI) test operation, the quick processing comprising:

a data input module configured to:
(i) read PCB design files and Bill of Materials (BOM) files inputted, and
(ii) generate core data having:
text data of all components to be assembled, including component codes, component descriptions, component profile names, and component height, and
graphic data of all components to be assembled, including frame size of components, pin size of components, pin quantity, pin pitch, identification of polarity points, and location of the first pin;

a core data module, to connect with the data input module, and to share data with the SMT equipment system and a component shared database, including:
a memory storing a local database, to share the data with the SMT equipment system and the component shared database, and to store built-in component data, or component data derived from the SMT equipment system or the component shared database, the component data includes attribute information, packaging information, polarity information, the graphic data, and nozzle information and feeder information corresponding to each component; and
a processor programmed to function as:
a search unit, to connect with the data input module and the local database, to read the core data from the data input module, to search the local database for component data of each component to be assembled based on the core data, to link found component data with the corresponding component to be assembled, in which the component data is marked as an available component, and to output a command for creating component data not found in the local database;
a creation unit, to connect with the data input module, the local database, and the search unit, and after receiving the command for creating component data, to create component data based on the core data of the component to be assembled, to store the created component data in the local database, and to mark the component data as an available component; and
a verification unit, to connect with the data input module and the local database, to verify the component data marked as an available component in the local database, and to recover the component data marked as the available component based on the graphic data in the core data when an error is determined; and a data output module, to connect with the core data module and the SMT equipment system, to output the component data verified by the verification unit to the SMT equipment system, wherein the SMT equipment system performs the PCB assembly or the AOI test operation based on the outputted component data.

2. The quick processing system for SMT equipment according to claim 1, wherein the PCB design files include Computer Aided Design (CAD) files and Gerber files.

3. The quick processing system for SMT equipment according to claim 2, wherein
when the search unit searches for the component data of each component to be assembled, the search unit firstly determines whether an attribute of the component to be assembled is found in the local database based on the text data;
if yes, the search unit links the found component data with the corresponding component to be assembled, and marks the component data as an available component;
if no, the search unit determines whether the attribute of the component to be assembled is found in the local database based-on the graphic data; and
if yes, the search unit links the found component data with its corresponding component data to be assembled, and marks the component data as an available component.

4. The quick processing system for SMT equipment according to claim 2, wherein
after the creation unit receives the command for creating the component data, the creation unit first determines the format of the PCB design files, and when the PCB design file is determined as a CAD file, the creation unit creates component data based on the core data of the component to be assembled; and
when the PCB design file is determined as a Gerber file, the creation unit first creates pin information of the component to be assembled, followed by creating component data based on the core data of the component to be assembled.

5. The quick processing system for SMT equipment according to claim 2, wherein
when the verification unit verifies the component data marked as an available component in the local database,
the verification unit first verifies whether the frame size of components, pin size of components, pin quantity, pin pitch, identification of polarity points, and location of the first pin in the component data are consistent with its core data;
if yes, then the component data passes verification; and
if no, then the verification unit outputs a validation error message, and based on the graphic data of the core data, fixes the frame size of components, pin size of components, pin quantity, pin pitch, identification of polarity points, and location of the first pin in the component data of the available component to coincide with its core data.

6. A quick processing method for Surface Mount Technology (SMT) equipment that controls the SMT equipment to perform a Printed Circuit Board (PCB) assembly or an Automatic Optic Inspection (AOI) test operation, the quick processing method comprising the following steps:
creating a local database, which prestores built-in component data, or component data derived from the SMT equipment system or a component shared database, the component data includes attribute information, packaging information, polarity information, graphics data of components to be assembled, and nozzle information and feeder information corresponding to each component;
reading PCB design files and Bill of Materials (BOM) files inputted, and generating core data having:
text data of all the components to be assembled, including component codes, component descriptions, component profile names, and component height, and
the graphic data of all the components to be assembled, including frame size of components, pin size of components, pin quantity, pin pitch, identification of polarity points, and location of the first pin;
reading the core data, and searching the local database for component data of each component to be assembled based on the core data, linking the found component data with the corresponding component to be assembled, marking the component data as an available component, and outputting a command for creating component data not found in the local database;
creating component data based on the core data of the component to be assembled, storing the created component data in to the local database, and marking the component data as an available component;
verifying the component data marked as an available component in the local database, and recovering the component data marked as the available component based on the graphic data in the core data when an error is determined; and
outputting the verified component data to the SMT equipment, wherein the SMT equipment performs the PCB assembly or the AOI test operation based on the outputted component data.

7. The quick processing method for SMT equipment according to claim 6, wherein the PCB design files include Computer Aided Design (CAD) files and Gerber files.

8. The quick processing method for SMT equipment according to claim 7, wherein
when the searching for the component data of each component to be assembled, firstly determining whether an attribute of the component to be assembled is found in the local database based on the text data;
if yes, linking the found component data with the corresponding component to be assembled, and marking the component data as an available component;
if no, determining whether the attribute of the component to be assembled is found in the local database based on the graphic data; and
if yes, linking the found component data with its corresponding component data to be assembled, and marking the component data as an available component.

9. The quick processing method for SMT equipment according to claim 7, wherein
after the receiving the command for creating component data, first determining the format of the PCB design files, and when the PCB design file is determined as a CAD file, creating component data based on the core data of the component to be assembled; and
when the PCB design file is determined as a Gerber file, first creating pin information of the component to be assembled, followed by creating component data based on the core data of the component to be assembled.

10. The quick processing method for SMT equipment according to claim 7, wherein
when verifying the component data marked as an available component in the local database,
first verifying whether the frame size of components, pin size of components, pin quantity, pin pitch, identification of polarity points, and location of the first pin in the component data are consistent with its core data;
if yes, then the component data passes verification; and
if no, then outputting a validation error message, and based on the graphic data of the core data, fixing the frame size of components, pin size of components, pin quantity, pin pitch, identification of polarity points, and location of the first pin in the component data of the available component to coincide with its core data.

* * * * *